(12) United States Patent
Mizuno et al.

(10) Patent No.: US 8,916,264 B2
(45) Date of Patent: Dec. 23, 2014

(54) POLYESTER FILM FOR SOLAR CELLS

(75) Inventors: Naoki Mizuno, Otsu (JP); Mutsuo Nishi, Tsuruga (JP); Jun Inagaki, Tsuruga (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 324 days.

(21) Appl. No.: 13/499,077

(22) PCT Filed: Sep. 28, 2010

(86) PCT No.: PCT/JP2010/066805
§ 371 (c)(1),
(2), (4) Date: Mar. 29, 2012

(87) PCT Pub. No.: WO2011/040398
PCT Pub. Date: Apr. 7, 2011

(65) Prior Publication Data
US 2012/0183792 A1 Jul. 19, 2012

(30) Foreign Application Priority Data
Sep. 29, 2009 (JP) ................................. 2009-223858

(51) Int. Cl.
*B23B 3/26* (2006.01)
*B32B 15/09* (2006.01)
*B32B 15/20* (2006.01)
*B32B 27/18* (2006.01)
*B32B 27/36* (2006.01)
*H01L 31/0216* (2014.01)
*B32B 3/26* (2006.01)
*C08J 5/18* (2006.01)

(52) U.S. Cl.
CPC ............ *H01L 31/02167* (2013.01); *B32B 3/26* (2013.01); *Y02E 10/52* (2013.01); *C08J 5/18* (2013.01); *C08J 2367/02* (2013.01); *Y10S 428/9122* (2013.01)
USPC ...... 428/308.4; 428/458; 428/480; 428/912.2

(58) Field of Classification Search
None
See application file for complete search history.

(56) References Cited

U.S. PATENT DOCUMENTS

| 6,451,959 | B1 * | 9/2002 | Ohmatsuzawa et al. ...... 528/279 |
| 7,261,934 | B2 | 8/2007 | Kusume et al. |
| 2001/0036545 | A1 | 11/2001 | Nishi et al. |
| 2003/0068466 | A1 * | 4/2003 | Mimura et al. ............... 428/102 |
| 2004/0266930 | A1 | 12/2004 | Nishi et al. |
| 2006/0263592 | A1 | 11/2006 | Kusume et al. |
| 2006/0286363 | A1 | 12/2006 | Nishi et al. |
| 2008/0254396 | A1 * | 10/2008 | Quintens ........................ 430/348 |
| 2009/0114279 | A1 | 5/2009 | Zhao et al. |

FOREIGN PATENT DOCUMENTS

| CN | 101431115 A | 5/2009 |
| EP | 1 142 937 A2 | 10/2001 |
| EP | 1 302 788 A1 | 4/2003 |
| EP | 1 666 521 A1 | 6/2006 |
| EP | 2 221 336 A1 | 8/2010 |
| JP | 2000-114565 A | 4/2000 |
| JP | 2002-026354 A | 1/2002 |
| JP | 3567927 B2 | 9/2004 |
| JP | 3589232 B2 | 11/2004 |
| JP | 3589233 B2 | 11/2004 |
| JP | 2005-125700 A | 5/2005 |
| JP | 2006-282970 A | 10/2006 |
| JP | 2007-208179 A | 8/2007 |
| JP | 2007-253463 A | 10/2007 |
| JP | 4023220 B2 | 12/2007 |
| JP | 2008-085270 A | 4/2008 |
| JP | 2009-182186 A | 8/2009 |
| JP | 2010-192743 A | 9/2010 |
| WO | WO 2005/026241 A1 | 3/2005 |

OTHER PUBLICATIONS

Japanese Patent Office, International Search Report in International Patent Application No. PCT/JP2010/066805 (Nov. 9, 2010).
Chinese Patent Office, Office Action in Chinese Patent Application No. 201080043489.0 (Jan. 4, 2013).
European Patent Office, Extended European Search Report for European Patent Application No. 10820513.9 (Oct. 22, 2014).

* cited by examiner

*Primary Examiner* — Ramsey Zacharia
(74) *Attorney, Agent, or Firm* — Leydig, Voit & Mayer, Ltd.

(57) ABSTRACT

The invention provides a polyester film suitable for a back sheet for solar cells, which requires a high reflectance not only in the visible light region but also in the near-infrared region, and also requires a low reflection directivity. The polyester film is a cavity-containing polyester film having an average reflectance of 70-95% in a wavelength range of 400-1200 nm and an average transmittance of 5-30% in a wavelength range of 700-1200 nm.

12 Claims, No Drawings

POLYESTER FILM FOR SOLAR CELLS

TECHNICAL FIELD

The present invention relates to a polyester film for solar cells, and in particular, relates to a polyester film for solar cells that is, when used for back sheets for solar cells, suitable for a back sheet for solar cells capable of obtaining a certain reflectance, particularly a high reflectance in the infrared region.

BACKGROUND ART

In recent years, solar cells attract attention as energy means to replace petroleum energy, which is a cause of global warming, and are increasingly demanded. A solar cell is a solar power generation system that converts the energy of sunlight directly into electricity, and the heart of the solar cell is formed of semiconductors. The structure of the solar cell is such that a solar cell element is not used solely as it is. Generally, several to several tens of solar cell elements are unitized by wiring them in series or in parallel and packaging them in various manners to protect the elements over a long period of time (for 20 years or longer). The unit incorporated in the package is termed a solar cell module, which generally has a structure where: the side of the solar cell module that receives sunlight is covered by glass; gaps are filled with a filling material formed of a thermoplastic resin; and the back side is protected by a protective sheet termed a back sheet and having a multilayer structure formed of a heat resistant and weather resistant plastic material and the like.

In the case of, for example, a solar cell module using thin-film silicon, the back sheet generally has the lamination structure of, starting from the solar cell element side, a polyester film/an adhesive/a moisture-proof layer such as a metal foil or a film including a metallic thin-film layer/an adhesive/a polyvinyl fluoride film or a polyester highly durable moisture-proof film (the outermost layer).

To improve the conversion efficiency of the solar cell, the solar cell elements and the back sheet for solar cells are modified. For example, even when light incident from the front side of the solar cell module has transmitted through the solar cell elements, the light is made incident on the solar cell elements again by reflecting it. Such an efficient use of the light makes it possible to increase photovoltaic power.

Accordingly, the back sheet for solar cells requires a high reflectance, and also requires a low reflection directivity in order to uniformly reflect light to nearby elements. Further, crystalline silicon to be used as a solar cell element has a sensitivity in the wavelength range of from 400 to 1200 nm, and therefore, has a high sensitivity in the near-infrared region rather than in the visible light region. Thus, the reflection properties of the back sheet for solar cells are important not only in the visible light region but also in the near-infrared region (wavelengths of from 700 to 1200 nm). In response, as a polyester film to be used for the back sheet for solar cells, the following are proposed, for example.

Patent Document 1 proposes a film for sealing the back side of a solar cell, which improves the reflection efficiency by mixing a polyethylene terephthalate resin with an incompatible resin and using air bubbles generated during the manufacturing of the film and exemplifies a film for sealing the back side of a solar cell, having a reflectance of from 84 to 87% at a wavelength of 560 nm.

Patent Document 2 proposes a plastic film for a protecting film of the back surface of a solar cell, obtained by blending a white coloring agent in plastic forming a plastic film, and exemplifies a plastic film for a protecting film of the back side of a solar cell, having an average reflectance of from 82 to 93% in the wavelength range of from 600 to 1400 nm.

Patent Document 3 proposes a white polyester film for a protecting film of the back surface of a solar cell, in which a polyester resin contains barium sulfate particles and exemplifies a white polyester film for a film protecting film of the back surface of a solar cell, having an average reflectance of from 86 to 97% in the visible light region of wavelengths of from 400 to 700 nm.

Patent Document 4 proposes a solar cell module using: a biaxially stretched polyethylene terephthalate film kneaded with a white pigment; a polyethylene terephthalate film containing fine air bubbles; or a resin film including a coating film layer having light reflectivity and exemplifies a back cover film having a total light reflectance of 95% and 97%.

PRIOR ART DOCUMENTS

Patent Document

Patent Document 1: JP-A No. 2008-85270
Patent Document 2: JP-A No. 2007-208179
Patent Document 3: JP-A No. 2009-182186
Patent Document 4: JP-A No. 2000-114565

SUMMARY OF THE INVENTION

Problems to be Solved by the Invention

As described above, a back sheet for solar cells requires a high reflectance not only in the visible light region but also in the near-infrared region, in order to obtain a high conversion efficiency of a solar cell module, and a demand for such a high reflectance is expected to increase in the future.

Generally, to provide a film with light reflectivity, a technique is used, as described above in Patent Documents, of adding a blowing agent or a white pigment to the film and the reflectance is improved by increasing the amount of the addition agent to be added. In such a method, however, not only is the improvement of the reflectance small both in the visible light region and the near-infrared region, but also the addition of a large amount of the blowing agent or the white pigment reduces the mechanical strength such as tensile strength, and promotes the occurrence of fold creases. This places a limitation on the maintenance of the strength.

In view of the above problems, it is an object of the present invention to provide a polyester film for solar cells suitable for a back sheet for solar cells that requires a high reflectance not only in the visible light region but also in the near-infrared region, and also requires a low reflection directivity.

Solutions to the Problems

As a result of diligent studies of the reflectance of a polyester film for solar cells, particularly the reflectance in the near-infrared region, the present inventors have found that unlike a conventional technique of, in the solar cell structure described above, adding a large amount of a blowing agent or a white pigment to improve the reflectance of a light reflecting film alone, the use of a white film having a predetermined near-infrared transmittance makes it possible to obtain a high reflectance not only in the visible light region but also particularly in the near-infrared region by making effective use of a high reflectance of a light reflecting layer placed on a back side, such as a metallic moisture-proof layer formed of an aluminum foil or the like, and also obtain a low reflection directivity. The present invention has been based on the findings.

That is, it is possible to solve the above problems by the following solution.

A first aspect of the present invention is a polyester film for solar cells including a cavity-containing polyester film having: an average reflectance of 70% or greater and 95% or less in a wavelength range of from 400 to 1200 nm; and an average transmittance of 5% or greater and 30% or less in a wavelength range of from 700 to 1200 nm.

A second aspect of the present invention is the polyester film for solar cells, wherein a cyclic trimer content of the polyester film is 5000 ppm or less.

A third aspect of the present invention is the polyester film for solar cells, wherein the polyester film contains aluminum and/or a compound thereof and a phenolic compound.

A forth aspect of the present invention is a back sheet for solar cells comprising: the polyester film for solar cells; and a light reflecting layer placed on one side of the polyester film for solar cells.

A fifth aspect of the present invention is a back sheet for solar cells, wherein the light reflecting layer is a metal foil or a metallic thin-film layer containing at least one of aluminum and silver.

Effects of the Invention

A back sheet for solar cells using a polyester film for solar cells according to the present invention is capable of obtaining a high reflectance not only in the visible light region but also in the near-infrared region, and also has a low reflection directivity.

MODE FOR CARRYING OUT THE INVENTION

A polyester film for solar cells according to the present invention has a cavity-containing polyester film as a main component. The control of the volume and the form of voids contained in the film makes it possible to obtain a polyester film for solar cells having an average reflectance of 70% or greater and 95% or less in the wavelength range of from 400 to 1200 nm, and having an average transmittance of 5% or greater and 30% or less in the wavelength range of from 700 to 1200 nm. A light reflecting layer such as a metal layer is placed on the back side of such a polyester film for solar cells, whereby it is possible to obtain a back sheet for solar cells having a high light reflectivity and a low reflection directivity. It is possible to obtain the cavity-containing polyester film of the present invention by, for example, moderately dispersing in a polyester resin a thermoplastic resin incompatible with the polyester resin, and stretching the resulting product.

The polyester resin is one having as a main constituent unit an ester unit formed of a dicarboxylic acid (or an ester derivative thereof) and a glycol. Examples of the dicarboxylic acid include aromatic dicarboxylic acids such as terephthalic acid, isophthalic acid, and naphthalene dicarboxylic acid, or ester (alkyl ester, e.g., methyl ester) derivatives thereof, and known aliphatic dicarboxylic acids. Further, examples of the glycol include ethylene glycol, diethylene glycol, 1,3-propanediol, 1,4-butanediol, neopentyl glycol and the like. It is possible to manufacture these polyester resins by: a method of causing a dicarboxylic acid and a glycol to react directly with each other; a method of causing an alkyl ester of a dicarboxylic acid and a glycol to perform a transesterification reaction with each other, and subsequently polycondensing the resulting product; or a method of polycondensing diglycol esters of dicarboxylic acids.

A polycondensation catalyst to be used for the polycondensation of the polyester resin of the present invention can be selected from among antimony compounds, aluminum compounds, titanium compounds, and germanium compounds. Further, as the polycondensation catalyst, one catalyst may be used, or two or more catalysts may be used together.

A polyester composition to be used for the polyester film of the present invention is manufactured by adding a magnesium compound, a potassium compound, and a phosphorus compound to the polycondensation catalyst in the same reaction can. The polyester composition will be described in detail later.

A suitable polycondensation catalyst to be used for the polycondensation of the polyester is, although not particularly limited, antimony trioxide due to its inexpensiveness and its excellent catalytic activity as a catalyst. It is possible to employ a known method to obtain a polyester resin using antimony trioxide as a catalyst. Polyester resins named in Japanese Patent Publication No. 4023220 can be exemplified.

The polycondensation catalyst is, as well as the above, preferably a germanium compound or a titanium compound. More preferred examples of the polycondensation catalyst include: catalysts containing aluminum and/or compounds thereof and phenolic compounds; catalysts containing aluminum and/or compounds thereof and phosphorus compounds; and catalysts containing aluminum salts of phosphorus compounds. This is because the use of a catalyst containing aluminum and/or a compound thereof and a phosphorus compound makes it possible to reduce the generation of a cyclic trimer in an extruding machine that is performing the process of manufacturing the film, in a stretching process, and in a heat fixation process as compared to the case of employing a polyester resin obtained by polymerization using an antimony trioxide catalyst. The reason for this is not clear; however, it is guessed that a catalyst containing aluminum and/or a compound thereof and a phosphorus compound has the effect of suppressing the thermal degradation of a polyester resin.

A description is given below of a catalyst containing aluminum and/or a compound thereof and a phosphorus compound, the catalyst capable of being used in the present invention. As a matter of course, however, the catalyst is not limited to this, It is possible to use, as well as metallic aluminum, a known aluminum compound as the aluminum and/or the aluminum compound thereof with no limitation.

Specifically, examples of the aluminum compound include: carboxylate salts such as aluminum formate, aluminum acetate, basic aluminum acetate, aluminum propionate, aluminum oxalate, aluminum acrylate, aluminum laurate, aluminum stearate, aluminum benzoate, aluminum trichloroacetate, aluminum lactate, aluminum citrate, and aluminum salicylate; inorganic acid salts such as aluminum chloride, aluminum hydroxide, aluminum hydroxychloride, aluminum carbonate, aluminum phosphate, and aluminum phosphonate; aluminum alkoxides such as aluminum methoxide, aluminum ethoxide, aluminum n-propoxide, aluminum iso-propoxide, aluminum n-butoxide, and aluminum t-butoxide; aluminum chelate compounds such as aluminum acetylacetonate, aluminum acetylacetate, aluminum ethylacetoacetate, and aluminum ethylacetoacetate diisopropoxide; organic aluminum compounds such as trimethylaluminium and triethylaluminium; partial hydrolysates thereof; and aluminum oxide. Among the above aluminum compounds, carboxylate salts, inorganic acid salts, and chelate compounds are preferred, and among these, aluminum acetate, aluminum chloride, aluminum hydroxide, aluminum hydroxychloride, and aluminum acetylacetonate are particularly preferred.

The amount of the aluminum and/or the aluminum compound thereof to be added is preferably from 0.001 to 0.05 mole % and is more preferably from 0.005 to 0.02 mole %, relative to the mole number of all the constituent units of the carboxylic acid component such as a dicarboxylic acid or a polyvalent carboxylic acid of the polyester to be obtained. If the amount to be added is less than 0.001 mole %, catalytic activity may not be exerted sufficiently. If the amount to be added is 0.05 mole % or greater, problems may arise such as decreases in the thermal stability and the thermal oxidative stability, and the occurrence of foreign matter and an increase in coloration that are caused by the catalyst. The polymerization catalyst of the present invention is significantly characterized by showing sufficient catalytic activity even if the amount of the aluminum component to be added is thus small. This makes it possible to provide an excellent thermal stability and an excellent thermal oxidative stability, and reduce foreign matter and coloration that are caused by the catalyst.

The phenolic compound contained in the polycondensation catalyst is not particularly limited so long as it is a compound having a phenolic structure. Examples of the phenolic compound may include 2,6-di-tert-butyl-4-methylphenol, 2,6-di-tent-butyl-4-ethylphenol, 2,6-dicyclohexyl-4-methylphenol, 2,6-diisopropyl-4-ethylphenol, 2,6-di-tert-amyl-4-methylphenol, 2,6-di-tert-octyl-4-n-propylphenol, 2,6-dicyclohexyl-4-n-octylphenol, 2-isopropyl-4-methyl-6-tert-butylphenol, 2-tert-butyl-2-ethyl-6-tert-octylphenol, 2-isobutyl-4-ethyl-6-tert-hexylphenol, 2-cyclohexyl-4-n-butyl-6-isopropylphenol, 1,1,1-tris(4-hydroxyphenyl)ethane, 1,1,3-tris(2-methyl-4-hydroxy-5-tert-butylphenyl)butane, triethylene glycol-bis[3-(3-tert-butyl-5-methyl-4-hydroxyphenyl)propionate], 1,6-hexanediol-bis[3-(3,5-di-tert-butyl-4-hydroxyphenyl)propionate], 2,2-thiodiethylenebis[3-(3,5-di-tert-butyl-4,4-hydroxyphenyl)propionate], N,N-hexamethylenebis(3,5-di-tert-butyl-4-hydroxyhydrocinnamide), 1,3,5-tris(2,6-dimethyl-3-hydroxy-4-tert-butylbenzyl)isocyanurate, 1,3,5-tris(3,5-di-tert-butyl-4-hydroxybenzyl)isocyanurate, 1,3,5-tris[(3,5-di-tert-butyl-4-hydroxyphenyl)propionyloxyethyl]isocyanurate, tris(4-tert-butyl-2,6-dimethyl-3-hydroxybenzyl)isocyanurate, 2,4-bis(n-octylthio)-6-(4-hydroxy-3,5-di-tert-butylanilino)-1,3,5-triazine, tetrakis[methylene(3,5-di-tert-butyl-4-hydroxy)hydrocinnamate]methane, bis[(3,3-bis(3-tert-butyl-4-hydroxyphenyl)butyric acid)glycol ester, N,N'-bis[3-(3,5-di-tert-butyl-4-hydroxyphenyl)propionyl]hydrazine, 2,2'-oxamidebis[ethyl-3-(3,5-di-tert-butyl-4-hydroxyphenyl) propionate], bis[2-tert-butyl-4-methyl-6-(3-tert-butyl-5-methyl-2-hydroxybenzyl)phenyl]terephthalate, 1,3,5-trimethyl-2,4,6-tris(3,5-di-tert-butyl-4-hydroxybenzyl)benzene, 3,9-bis[1,1-dimethyl-2-{β-(3-tert-butyl-4-hydroxy-5-methylphenyl)propionyloxy}ethyl]-2,4,8,10-tetraoxaspiro[5,5]undecane, 2,2-bis[4-(2-(3,5-di-tert-butyl-4-hydroxycinnamoyloxy))ethoxyphenyl]propane, β-(3,5-di-tert-butyl-4-hydroxyphenyl)propionic acid alkyl ester, tetrakis[methyl-3-(3',5'-di-tert-butyl-4-hydroxyphenyl)propionate]methane, octadecyl-3-(3,5-di-tert-butyl-4-hydroxyphenyl)propionate, 1,1,3-tris(2-methyl-4-hydroxy-5-tert-butylphenyl)butane, thiodiethylene-bis[3-(3,5-di-tert-butyl-4-hydroxyphenyl)propionate], ethylenebis(oxyethylene)bis[3-(5-tert-butyl-4-hydroxy-m-tolyl)propionate], hexamethylenebis[3-(3,5-di-tert-butyl-4-hydroxyphenyl) propionate, triethyleneglycol-bis[3-(3'-tert-butyl-4-hydroxy-5-methylphenyl)]propionate, 1,1,3-tris[2-methyl-4-[3-(3,5-di-tert-butyl-4-hydroxyphenyl)propionyloxy]-5-tert-butylphenyl]butane, and the like.

It is possible to simultaneously use two or more of these together. Among these, 1,3,5-trimethyl-2,4,6-tris(3,5-di-tert-butyl-4-hydroxybenzyl)benzene, tetrakis[methyl-3-(3',5'-di-tert-butyl-4-hydroxyphenyl)propionate]methane, and thiodiethylene-bis[3-(3,5-di-tert-butyl-4-hydroxyphenyl) propionate] are preferred.

The addition of phenolic compounds among these at the polymerization of the polyester enhances the catalytic activity of the aluminum compound, and also improves the thermal stability of the polyester obtained by the polymerization.

The amount of the phenolic compound to be added is preferably from $5 \times 10^{-7}$ to 0.01 moles and is more preferably from $1 \times 10^{-6}$ to 0.005 moles, relative to the mole number of all the constituent units of the carboxylic acid component such as a dicarboxylic acid or a polyvalent carboxylic acid of the polyester to be obtained. Further, in the present invention, a phosphorus compound may also be used together with the phenolic compound.

The phosphorus compound contained in the polycondensation catalyst is not particularly limited, but is preferably one or two or more compounds selected from the group including phosphonic acid compounds, phosphinic acid compounds, phosphine oxide compounds, phosphonous acid compounds, phosphinous acid compounds, and phosphine compounds, because this significantly enhances the catalytic activity. Among these, it is preferable to use one or two or more phosphonic acid compounds, because this particularly significantly enhances the catalytic activity.

The phosphorus compound contained in the polycondensation catalyst is particularly preferably a compound containing a group having an aromatic ring structure.

Examples of the phosphorus compound contained in the polycondensation catalyst include dimethyl methylphosphonate, diphenyl methylphosphonate, dimethyl phenylphosphonate, diethyl phenylphosphonate, diphenyl phenylphosphonate, dimethyl benzylphosphonate, diethyl benzylphosphonate, diphenylphosphinic acid, methyl diphenylphosphinate, phenyl diphenylphosphinate, phenylphosphinic acid, methyl phenylphosphinate, phenyl phenylphosphinate, diphenylphosphine oxide, methyldiphenylphosphine oxide, triphenyiphosphine oxide and the like. Among these, dimethyl phenylphosphonate and diethyl benzylphosphonate are particularly preferred.

The amount of the phosphorus compound to be added is preferably from $5 \times 10^{-7}$ to 0.01 moles and is more preferably from $1 \times 10^{-6}$ to 0.005 moles, relative to the mole number of all the constituent units of the carboxylic acid component such as a dicarboxylic acid or a polyvalent carboxylic acid of the polyester to be obtained.

The phosphorus compound contained in the polycondensation catalyst and having a phenolic portion in its molecule is not particularly limited so long as it is a phosphorus compound having a phenolic structure, but the phosphorus compound is preferably one or two or more compounds selected from the group including phosphonic acid compounds, phosphinic acid compounds, phosphine oxide compounds, phosphonous acid compounds, phosphinous acid compounds, and phosphine compounds, each having a phenolic portion in its molecule, because this particularly significantly enhances the catalytic activity. Among these, it is preferable to use one or two or more phosphonate compounds each having a phenolic portion in its molecule, because this particularly significantly enhances the catalytic activity.

The catalyst for the polyester to be used in the present invention has catalytic activity not only in a polymerization reaction but also in an esterification reaction and a transesterification reaction. For example, polymerization by the transesterification reaction between an alkyl ester of a dicarboxylic acid such as dimethyl terephthalate and a glycol such as ethylene glycol is normally performed in the presence of a transesterification catalyst such as a titanium compound or a zinc compound. The catalyst according to the claims of the present invention, however, can also be used instead of, or together with, these catalysts. Further, the catalysts described above have catalytic activity not only in a melt polymerization but also in a solid-phase polymerization and a solution polymerization. This makes it possible to manufacture by any of these methods a polyester resin suitable for the manufacturing of a polyester film for solar cells.

Typical examples of such a polyester resin include polyethylene terephthalate, polytrimethylene terephthalate, polyethylene butylene terephthalate, and polyethylene-2,6-naphthalate. The polyester may be a homopolymer, or may be copolymerized with a third component. In the present invention, it is recommended that a polyester should be used in which ethylene terephthalate units, propylene terephthalate units, butylene terephthalate units, or ethylene-2,6-naphthalate units are 70 mole % or greater, are preferably 80 mole % or greater, and are more preferably 90 mole % or greater, relative to 100 mole % of the constituent units.

The thermoplastic resin incompatible with the polyester resin (hereinafter occasionally referred to simply as an "incompatible thermoplastic resin") acts as a cavity-producing agent, and contributes to the formation of voids in the film. The incompatible thermoplastic resin becomes uniformly mixed into the polyester resin in a dispersed manner, and separates from the base resin at the interface therebetween during stretching, thereby serving as a cavity formation source. The incompatible thermoplastic resin capable of being used in the present invention is not particularly limited so long as it phase-separates when melt-mixed with the polyester resin by a general method. The incompatible thermoplastic resin may be a homopolymer, or may be a polymer containing a copolymerization component. In the present invention, a polyolefin resin is preferred in view of the production of suitably shaped voids.

Examples of the polyolefin resin include polyethylene resins, polypropylene resins, polybutene resins, polymethylpentene resins and the like. Among these, polymethylpentene resins are suitable due to their propensity not to soften even at high temperature, and their excellent cavity production property. One of these polyolefin resins may be used solely, or two or more of them may be mixed for use.

When the film of the present invention is formed, it is recommended that the usage of the incompatible thermoplastic resin should be 3 parts by mass or greater and should preferably be 4 parts by mass or greater, and should be 20 parts by mass or less and should preferably be 10 parts by mass or less, relative to 100 parts by mass of the polyester resin, and should more preferably be 4 parts by mass or greater and 8 parts by mass or less. If the usage of the incompatible thermoplastic resin is below the ranges, voids may be formed insufficiently, which may increase the reflection directivity. On the other hand, if the usage of the incompatible thermoplastic resin is above the ranges, it is not possible to make sufficient use of the reflection effect of the light reflecting layer placed on the back side. Consequently, not only it is impossible to obtain a sufficient reflectance particularly in the near-infrared region, but also it is likely to cause the breaking of the film and fold creases during the manufacturing of the film. This significantly reduces productivity.

When used, the incompatible thermoplastic resin is preferably blended with another incompatible thermoplastic resin as a dispersion resin. The dispersion resin is a thermoplastic resin incompatible with both the polyester resin and the incompatible thermoplastic resin to be added as the cavity-producing agent, and has a surface tension (surface energy) greater than that of the cavity-producing agent. The blending of the dispersion resin provides a "dispersing action" of finely dispersing in a raw material resin a thermoplastic resin incompatible with a polyester, and causes the cavity-producing agent and the polyester resin to dissociate from each other in a suitable manner, which, therefore, has the effect of uniformly forming minute voids. Examples of the dispersion resin having such functions include polystyrene resins.

The polystyrene resins may be homopolymers, or may be copolymers containing various copolymerization components. It is, however, required that in the case of copolymers, the copolymerization components should not impair the effects of the present invention.

The lower limit of the content of the dispersion resin is 10 parts by mass, is preferably 15 parts by mass, and is more preferably 20 parts by mass, relative to 100 parts by mass of the incompatible thermoplastic resin. The upper limit is 50 parts by mass, is preferably 40 parts by mass, and is particularly preferably 30 parts by mass. If the content of the dispersion resin is less than 10 parts by mass, the dispersibility of voids decreases. On the other hand, if the content of the dispersion resin is over 50 parts by mass, the sizes of voids may not be uniform.

Near-infrared light having relatively long wavelengths, namely in the wavelength region of from 700 to 1200 nm, is likely to reflect from cavity interfaces (air-resin interfaces), which have large refractive index differences. Thus, the use of the cavity-producing agent and the dispersion resin as described above facilitates a suitable formation of voids. Particularly, in the present invention, the shapes of voids are important for the reflection of near-infrared light. That is, in the case of flat voids larger in the plane directions thereof than in the thickness directions, it is possible to provide an excellent balance between the reflection of near-infrared light and the transmission of rays of light. In the present invention, as described above, the cavity-producing agent and the dispersion resin are controlled so as to be in suitable ranges, whereby voids are produced more uniformly, and are formed so as to be flat relative to the thicknesses thereof. Further, the intrinsic viscosity of the polyester resin that forms the film is made relatively high by a solid-phase polymerization, whereby it is possible to separate the polyester resin significantly from the cavity-producing agent at the interface therebetween. This makes it possible to suitably produce voids.

The contained volume and the shapes of voids produced in the film are controlled on the basis of the types and the concentrations of addition agents as described above, whereby it is possible to obtain a polyester film for solar cells having an average reflectance of 70 or greater and 95% or less in the wavelength range of from 400 to 1200 nm, and having an average transmittance of 5% or greater and 30% or less in the wavelength range of from 700 to 1200 nm. If the contained volume of voids is small, the average reflectance may be less than 70% in the wavelength range of from 400 to 1200 nm, which may increase the reflection directivity. On the other hand, if the contained volume of voids is large, not only may the mechanical strength decrease, but also the average reflectance may exceed 95% in the wavelength range of from 400 to 1200 nm. Consequently, it may not be possible to fully utilize the reflection properties of the reflective layer such as a metal layer placed on the back side of the film. Further, the lower limit of the average reflectance is preferably 72% and is more preferably 75% in the wavelength range of from 400 to 1200 nm. The upper limit of the average reflectance is preferably 93% and is more preferably 90% in the wavelength range of from 400 to 1200 nm.

In addition, if the average transmittance is less than 5% in the wavelength range of from 700 to 1200 nm, which is the near-infrared region, it is not possible to fully utilize the reflection properties of the reflective layer such as a metal layer placed on the back side. If the average transmittance is over 30% in the wavelength range of from 700 to 1200 nm, the reflection directivity may increase. The lower limit of the average transmittance is preferably 6% or greater and is more preferably 8% or greater in the wavelength range of from 700 to 1200 nm. Further, the upper limit of the average transmittance is preferably 28% or less and is more preferably 25% or less in the wavelength range of from 700 to 1200 nm.

Rays of light in the near-infrared region are less likely to be scattered than those in the visible light region, If, however, the shapes of voids have curved surfaces approximating spherical shapes, rays of light in the near-infrared region are significantly scattered. Thus, to obtain in the above ranges the average transmittance in the near-infrared region, it is preferable to control the shapes of voids so as to be long and flat, It is possible to achieve such shapes by, as described above, appropriately adjusting preferably the intrinsic viscosity of the polyester resin, and the type of the incompatible thermoplastic resin, the combination (particularly the combination with the dispersion agent), and the concentration of the incompatible thermoplastic resin to be added.

The 60° gloss value of the film of the present invention is preferably 70 or less and is more preferably 60 or less. If the 60° gloss value is 70 or less, the reflection directivity of light is small, This makes it possible to make efficient use of rays of light radiating a solar cell.

When the film of the present invention is formed, the film may contain particles in order to provide handling property, The type and the content of the particles are not particularly limited, and the type of the particles may be inorganic particles or organic particles. Examples of the particles, include inorganic particles inert to polyesters such as those of metal oxides, e.g., silica, titanium dioxide, talc, and kaolinite, calcium carbonate, calcium phosphate, barium sulfate and the like. Among these, titanium dioxide is preferred due to its industrially easy availability. Titanium oxide is known to have two crystalline forms, namely a rutile type and an anatase type. The properties of these types are such that the anatase type has a very high ultraviolet spectral reflectance, whereas the rutile type has a high ultraviolet absorptance (a low ultraviolet spectral reflectance). It is possible to select either one of these types as appropriate.

In addition, any one of the inert inorganic particles may be used solely, or two or more of them may be used together.

It is recommended that the content of the titanium oxide particles in the film of the present invention should be 0.1% by mass or greater and should preferably be 0.5% by mass or greater, and should be 30% by mass or less and should preferably be 20% by mass or less, relative to the total amount of the film. If the content of the titanium oxide particles is below the ranges, it may not be possible to ensure sufficient handling property. On the other hand, if the content of the titanium oxide particles is above the ranges, it may be difficult to perform operations such as stretching during the manufacturing of the film, which may reduce productivity.

In addition, it is recommended that: the lower limit of the average particle diameter of the titanium oxide particles should be 0.02 µm, should preferably be 0.05 µm, and should more preferably be 0.1 µm; and the upper limit should be 3 µm, should preferably be 2 µm, and should more preferably be 1 µm. If the average particle diameter of the titanium oxide particles is below the ranges, it may not be possible to obtain sufficient handling property. If the average particle diameter is above the ranges, coarse surface protrusions may be generated, which may have adverse effects on a moisture-proof layer to be laminated, such as a metal foil.

It is possible to measure the average particle diameter of the particles by the following method.

Pictures are taken of the particles with an electron microscope or an optical microscope, and the maximum diameters of 300 to 500 particles (the particle diameters of aggregates in the case of porous silica) are measured with such a magnification that the size of the smallest particle is from 2 to 5 mm. Then, the average value of the maximum diameters is used as the average particle diameter.

It is possible to employ a known method as the method of blending the particles with the polyester. It is possible to add the particles, for example, during a arbitrary step in the manufacturing of the polyester. The particles may be added as slurry obtained by dispersing the particles in ethylene glycol or the like, preferably during the esterification, or after the transesterification reaction and before the polycondensation reaction, and then, the polycondensation reaction may be performed. Alternatively, it is also possible to perform: a method of blending, using a vent-type kneading extruder, the polyester raw material with slurry obtained by dispersing the particles in ethylene glycol or water; a method of blending the dried particles with the polyester raw material, using a kneading extruder; and the like.

Among these, in the present invention, it is preferable to perform a method of uniformly dispersing aggregate of inorganic particles in a monomer liquid that is a part of the polyester raw material, and adding the filtrate of the resulting product to the remnant of the polyester raw material before, during, or after the esterification reaction. In this method, due to a low viscosity of the monomer liquid, it is possible to easily disperse the particles uniformly and filter slurry with high precision, and when the filtrate is added to the remnant of the raw material, the resultant has an excellent dispersibility of the particles, and therefore new aggregates are hard to generate. In this regard, it is preferable to add the filtrate to the remnant of the raw material particularly in a low-temperature state before the esterification reaction. This is suitable because it is also possible to reduce aggregates of a lubricant, and reduce the number of coarse surface protrusions by a method (master batch method) of obtaining a polyester containing particles in advance, and, for example, kneading and extruding a pellet of the polyester containing particles and a pellet not containing particles.

The cyclic trimer content of the polyester film of the present invention is preferably 5000 ppm or less. The cyclic trimer content is more preferably 4000 ppm or less and is particularly preferably 3500 ppm or less. If the cyclic trimer content is 5000 ppm or less, the hydrolysis of the film is suppressed. This facilitates obtaining the effect of maintaining durability, which is important property of a solar cell component.

The durability can be evaluated on the basis of the breaking elongation retention after 192 hours under the conditions of 105° C., 100% RH, and 0.03 MPa. The breaking elongation retention is preferably 65% or greater and is more preferably 70% or greater. In such ranges, the polyester film for solar cells of the present invention can achieve a high hydrolysis resistance as to withstand long-term outdoor use.

To obtain the cyclic trimer content of the polyester film in the above ranges, a polyester resin subjected to oligomer reduction treatment by a solid-phase polymerization method is preferably used as the raw material.

The solid-phase polymerization method in the present invention is, as described above, a method of heating a polyester resin in a solid-phase state under reduced pressure or under inert gas flow, and performing further polycondensation. A combination may be made of a method of heating a polyester resin in a solid-phase state under reduced pressure, and a method of performing heat treatment on a polyester resin under inert gas flow. Similarly to a melt polycondensation reaction, a solid-phase polymerization reaction can be performed by a batch-type apparatus or a continuous-type apparatus. The melt polycondensation and the solid-phase polycondensation may be performed continuously or separately. There is no limitation on the taking of measures such as removing oligomers, e.g., cyclic trimers, and by-products, e.g., acetaldehyde that are contained in the polyester resin. Further, a method may be used of, for example, refining a polyester resin by an extraction method such as a supercritical pressure extraction method to remove impurities such as the by-products described above.

It is desirable that the solid-phase polymerization described above should be performed at a temperature of 180° C. or above, and below the melting point, and should be performed particularly preferably at from 195 to 235° C. At the melting point or above, a polyester resin melts, which is impractical. Further, below 180° C., the rate of the reduction of a cyclic trimer is significantly low, which is not preferable, Furthermore, the solid-phase polymerization needs to be performed under inert gas flow or under reduced pressure. The inert gas means a gas that does not cause the deterioration of the polyester resin to be obtained as a result of the solid-phase polymerization, and generally, the inert gas is preferably nitrogen, which is inexpensive. The amount of moisture in the inert gas only needs to be in a range in which the limiting viscosity of the polyester resin does not decrease during the solid-phase polymerization. The amount of moisture is normally 500 ppm or less. If the solid-phase polymerization is performed under reduced pressure, the degree of vacuum is normally 0.1 KPa or less and is more preferably 0.05 KPa or less.

An apparatus for the solid-phase polymerization is preferably one capable of uniformly heating a resin pellet, such as a rotary solid-phase polymerization apparatus, a tower-type standing solid-phase polymerization apparatus, a fluidized-bed type solid-phase polymerization apparatus, or a solid-phase polymerization apparatus having various agitation blades.

In view of the durability of the polyester film, it is also preferable to use a polyester having a high molecular weight as a result of a solid-phase polymerization, or a polyester having a low acid value. This makes it possible to improve the hydrolysis resistance of the polyester film. In case of a polyester is provided with a high molecular weight by a solid-phase polymerization, the intrinsic viscosity of the polyester is preferably from 0.65 to 0.80 dl/g, in order to obtain a high heat resistance and a high hydrolysis resistance, and is more preferably from 0.70 to 0.75 dl/g. It should be noted that the intrinsic viscosity of the polyester can be measured by dissolving the polyester in a mixed solvent of parachlorophenol (6 parts by mass) and 1,1,2,2-tetrachloroethane (4 parts by mass), and measuring the resulting product at 30° C.

The polyester to be used in the present invention may contain another arbitrary polycondensate, an antistatic agent, a dyeing property improvement agent, a dye, a pigment, a delustering agent, a fluorescent whitening agent, a stabilizer, an antioxidant, or another addition agent. Examples of the antioxidant may include aromatic amine antioxidants and phenolic antioxidants. Examples of the stabilizer may include phosphorus stabilizers such as phosphoric acid stabilizers and phosphate ester stabilizers, sulfur stabilizers, and amine stabilizers.

The polyester film of the present invention may be a monolayer polyester film, or may be a laminated polyester film formed of at least three layers having outermost layers and a central layer. The structures of the layers in a three-layer structure may be such that the front and back outermost layers are the same in composition or different in composition. A two-type and three-layer structure (a layer A/a layer B/a layer A) is suitable in view of planarity.

If a three-layer structure is employed in the present invention, it is preferable that the outermost layers (the layers A in the case of the above two-type and three-layer structure) should contain particles, and the central layer (the layer B in the case of the above two-type and three-layer structure) should contain an incompatible thermoplastic resin.

The reason why the layers A contain particles is: to provide handling property for after processing such as laminating a moisture-proof function layer such as a metal or metal oxide thin-film layer or a coating layer; and to improve the adhesion with the function layer by increasing the surface areas of the layers A. The addition of particles to the outermost layers provides sufficient handling property suitable for processing. The handling property of the laminated film of the present invention can be evaluated on the basis of the coefficient of kinetic friction ($\mu d$) between the surfaces of the laminated film. In this case, the coefficient of kinetic friction ($\mu d$) is preferably 0.7 or less in view of processability.

The thickness of the film to be used in the present invention is not particularly limited, but can be arbitrarily determined in the range of from 30 to 350 μm, depending on the standard to be applied. The upper limit of the thickness of the base film is preferably 250 μm and is particularly preferably 200 μm. On the other hand, the lower limit of the thickness of the film is preferably 50 μm, is more preferably 75 μm, and is particularly preferably 100 μm. If the thickness of the film is less than 30 μm, the rigidity and the mechanical strength are likely to be insufficient. On the other hand, if the thickness of the film is over 300 μm, this results in high costs.

Next, a description is given of the method of manufacturing the polyester film of the present invention. The method of manufacturing the film of the present invention is not particularly limited. For example, however, a suitable film is a biaxially oriented polyester film obtained by: melting a mixture formed of the composition of a desired film (e.g., a mixture containing a polyester resin, an incompatible thermoplastic resin, a dispersion resin, and inorganic particles); extrusion-molding the melted mixture into a film to obtain an unstretched film; subsequently, as the need arises, uniaxially stretching the unstretched film in the longitudinal direction or the width direction, or sequentially biaxially stretching or simultaneously biaxially stretching the unstretched film in biaxial directions; and performing heat fixation treatment on the stretched film.

An unoriented cast film is obtained by: sufficiently vacuum-drying a pellet formed of a mixture containing a polyester resin, an incompatible thermoplastic resin, and inorganic particles; subsequently melting and extruding the vacuum-dried pellet into a sheet at from 270 to 295° C.; and cooling and solidifying the sheet. An uniaxially oriented polyester film is obtained by stretching the obtained cast film from 2.5 to 5.0 times in the longitudinal direction, using a roller heated to from 80 to 120° C.

Thereafter, the film is, while its both ends are held by clips, guided to a hot-air zone heated to from 80 to 180° C., is dried, and is subsequently stretched from 2.5 to 5.0 times in the width direction. Then, the film is guided to a heat treatment zone at from 220 to 240° C., is subjected to heat fixation treatment, and is cooled, thereby completing crystalline orientation. During the process of the heat treatment, relaxation treatment may also be performed by from 1 to 12%, in the width direction or the longitudinal direction where necessary.

In addition, when the film of the present invention is manufactured, it is preferable to remove foreign matter contained in the polyester raw material because the foreign matter causes protrusions. To remove foreign matter in the polyester, high-precision filtering is performed in a arbitrary place where the melted resin is maintained at about 280° C. during the melting and extrusion. A filter medium to be used for the high-precision filtering of the melted resin is not particularly limited. A suitable filter medium is, however, aggregates containing Si, Ti, Sb, Ge, Cu, or Al as a main component in the case of a filter medium formed of a stainless steel sintered body, or is a high-melting-point organic substance, due to their excellent removal performance.

The filtration particle size (an initial filtering efficiency of 95%) of the filter medium to be used for the high-precision filtering of the melted resin is preferably 25 μm or less. If the filtration particle size of the filter medium is over 25 μm, it is unlikely to sufficiently remove foreign matter 20 μm or greater. The high-precision filtering of the melted resin using a filter medium having a filtration particle size (an initial filtering efficiency of 95%) of 25 μm or less may reduce productivity. The high-precision filtering is, however, important for the obtaining of a film having fewer protrusions. It is preferable to minimize the retention time of the melted resin in the extruder in view of the generation of a cyclic trimer.

To provide adhesiveness between the polyester film of the present invention and other materials, the surfaces of the film may be subjected to surface modification treatment. Examples of the surface modification treatment include corona discharge treatment, glow discharge treatment, flame treatment, ultraviolet irradiation treatment, electron beam irradiation treatment, and ozone treatment.

In addition, in the present invention, to improve the adhesiveness with a resin for sealing solar cells, such as an ethylene-vinyl acetate copolymer, it is possible to provide an easily adhesion layer on one side of the polyester film for solar cells. The easily adhesion layer is not particularly limited so long as it has an excellent adhesiveness with the sealing resin. A suitable easily adhesion layer is one containing at least one of copolyester resins, acrylic resins, and polyurethane resins.

Examples of a coating liquid that forms the easily adhesion layer include water-soluble or water-dispersible copolyester solutions, acrylic solutions, and polyurethane solutions that are exemplified in Japanese Patent Publication No. 3567927. Japanese Patent Publication No. 3589232. and Japanese Patent Publication No. 3589233. for example. It is possible to obtain the easily adhesion layer by: applying the coating liquid to one side or both sides of a uniaxially lengthwise stretched polyester film; subsequently drying the coating liquid at from 100 to 150° C.; and stretching the resulting product in the transverse direction. The final coating amount of the easily adhesion layer is preferably controlled to he from 0.05 to 0.20 g/m². If the coating amount is less than 0.05 g/m², the adhesion with the sealing resin may be insufficient. If the coating amount is over 0.20 g/m², the blocking resistance may decrease.

It is preferable to add fine particles to the easily adhesion layer in order to provide slipperiness. The average particle diameter of the fine particles is preferably 2 μm or less. If the average particle diameter of the particles is over 2 μm, the particles are likely to falling from the easily adhesion layer. Examples of the particles to be contained in the easily adhesion layer include: inorganic particles such as calcium carbonate, calcium phosphate, amorphous silica, crystalline glass filler, kaolin, talc, titanium dioxide, alumina, silica-alumina complex oxide, barium sulfate, calcium fluoride, lithium fluoride, zeolite, molybdenum sulfide, and mica; and heat-resistant polymer particles such as crosslinked polystyrene particles, crosslinked acrylic resin particles, crosslinked methyl methacrylate particles, benzoguanamine formaldehyde condensation particles, melamine formaldehyde condensation particles, and polytetrafluoroethylene particles. Among these particles, silica particles are suitable due to their relatively inexpensive availability.

It is possible to employ a known method as the method of applying the coating liquid. Examples of the method include reverse roll coating methods, gravure coating methods, kiss coating methods, roll brushing methods, spray coating methods, air knife coating methods, wire bar coating methods, pipe doctor methods and the like. One of these methods may be performed solely, or any of them may be performed in combination.

A back sheet for solar cells of the present invention includes a polyester film for solar cells and a light reflecting layer placed on one side of the polyester film for solar cells, Thus, light having transmitted through the polyester film for solar cells, particularly light having wavelengths in the near-infrared region, is efficiently reflected from the light reflecting layer placed on the back side. This makes it possible to improve the conversion efficiency of a solar cell.

The light reflecting layer may be laminated directly on the polyester film for solar cells, but may be placed thereon through an adhesive layer or another transparent film layer. Further, the light reflecting layer may be a metal foil layer formed of, for example, an aluminum foil, or may be a transparent film layer on which a metal thin-film layer is laminated. The form of the back sheet for solar cells of the present invention is exemplified by the structure of a polyester film/an adhesive/a metal foil or a film including a metallic thin-film layer/an adhesive/a polyvinyl fluoride film or a polyester highly-durable moisture-proof film. Suitable examples of the metal foil or the film including a metallic thin-film layer to be used here as the light reflecting layer include metals or metal thin-film laminated films that have water vapor barrier property and have a relatively high reflectance in the wavelength range of from 400 to 1200 nm.

Examples of the types of the metals include aluminum, tin, magnesium, silver, stainless steel and the like. Among these, aluminum and silver are suitable due to their relatively high reflectance and their industrially easy availability. The metal layer may be the metal foil, or may be obtained by laminating the metal as a thin-film on a polyester film or the like. Examples of the method of laminating the metal as a thin-film include vacuum deposition methods, sputtering methods, ion plating methods, plasma chemical vapor deposition (CVD) and the like.

In the present invention, it is possible to manufacture the back sheet for solar cells by hot-pressing and molding a polyester film, a light diffusing layer such as a metal foil or a film including a metallic thin-film layer, and a polyvinyl fluoride film or a polyester highly-durable moisture-proof film, to form an one formed body of all the layers, using a general formation method such as a lamination method of integrating and hot-pressing by vacuum suction between each of the layers. In the above process, it is preferable to laminate the layers through an adhesive in order to improve the adhesiveness between all the layers. Examples of the adhesive include hot-melt adhesives, solvent-type adhesives, and light-curing adhesives, whose vehicles contain (meth)acrylic resins, olefinic resins, vinyl resins, and other types of resins, as main components.

Here, the highly-durable moisture-proof film is laminated in order to improve the weather resistance. Examples of the highly-durable moisture-proof film include: fluororesin films formed of polytetrafluoroethylene (PTFE), tetrafluoroethylene-perfluoroalkoxy copolymer (PFA), tetrafluoroethylene-hexafluoropropylene copolymer (FEP), 2-ethylene-tetrafluoroethylene copolymer (ETFE), polytrifluoroethylene (PCTFE), polyvinylidene fluoride (PVDF), polyvinyl fluoride (PVF) and the like; and films formed of resin compositions obtained by impregnating, with ultraviolet absorbents, resins such as polycarbonate, polymethylmethacrylate, polyacrylate, polyethylene terephthalate (PET), polyethylenenaphthalate (PEN), acrylic and the like.

EXAMPLES

The present invention is described below using examples, but is not limited thereto. It should be noted that descriptions are given below of evaluation methods used in each of the examples and comparative examples.

1. Measurement of Average Reflectance

The spectral reflectance was measured by, with an integrating sphere attached to a spectrophotometer (a self-recording spectrophotometer "UV-3150" manufactured by Shimadzu Corporation), making corrections so that the reflectance of a standard white plate (a white standard plate "ZRS-99-010-W" manufactured by SphereOptics GmbH) was 100%. The spectral reflectance was measured in the wavelength region of from 400 to 1200 nm every 1 nm to obtain the average value. The measurements of the film alone were made with a non-reflecting black cardboard placed on the back side of a sample film. The measurements of the film when a light reflecting layer is placed thereon were made with an aluminum foil (a thickness of 11 μm, an arithmetic surface roughness Ra of 0.11 μm) placed on the back side of the sample film.

2. Measurement of Average Transmittance

The spectral transmittance was measured by, with an integrating sphere attached to a spectrophotometer (a self-recording spectrophotometer "UV-3150" manufactured by Shimadzu Corporation), making corrections so that the transmittance with no sample was 100%. The spectral transmittance was measured in the wavelength region of from 700 to 1200 nm every 1 nm to obtain the average value.

3. Cyclic Trimer Content of Polyester Film

The cyclic trimer content of the polyester film was measured by the following method. 100 mg of the film sample was ground and accurately weighed, and was dissolved in 3 ml of a hexafluoroisopropanol-chloroform mixture (ratio by volume=2/3). Further, the solution was diluted by further adding thereto 20 ml of chloroform. 10 ml of methanol was added to the diluted solution to precipitate a polymer, and the resulting product was filtered. The filtrate liquid was evaporated to dryness, and the volume was fixed by 10 ml of dimethylformamide. Subsequently, the quantity of the cyclic trimer was determined by the following high-performance liquid chromatography method.

(Measurement Conditions)
Apparatus: L-7000 (manufactured by Hitachi, Ltd.)
Column: μ-Bondasphere C18, 5 μm, 100 angstroms, 3.9 mm×15 cm (manufactured by Waters Corporation)
Solvent: eluent A: 2% of acetic acid/water (v/v)
eluent B: acetonitrile
gradient B%: from 10 to 100% (from 0 to 55 minutes)
Flow rate: 0.8 ml/minute
Temperature: 30° C.
Detector: UV-259 nm 4. Average Particle Diameter Inert particles were observed with a scanning electron microscope (S-510 manufactured by Hitachi, Ltd.), and pictures were taken of the particles by appropriately changing magnifications in accordance with the sizes of the particles. Then, enlarged copies of the pictures were made. Subsequently, the peripheries of at least 300 randomly selected particles were traced, and the circle-equivalent diameters of the selected particles were measured from images of the traces, using an image analyzer, to obtain the average of the circle-equivalent diameters as the average particle diameter.

5. Intrinsic Viscosity of Polyester

The intrinsic viscosity of the polyester was measured by dissolving the polyester, using a mixed solvent in which parachlorophenol/1,1,2,2-tetrachloroethane was 6/4 (ratio by weight), and measuring the resulting product at a temperature of 30° C.

6. Breaking Elongation Retention (Evaluation of Hydrolysis Resistance)

To evaluate the hydrolysis resistance, the HAST (Highly Accelerated temperature and humidity Stress Test), which is standardized by JIS-60068-2-66. was performed. The test was performed under the conditions of 105° C., 100% RH, and 0.03 MPa, using EHS-221, manufactured by ESPEC Corp., as an instrument.

The film was cut into 70 mm×190 mm, and was placed using a jig. The cut pieces of the film were placed at such distances as not to make contact with each other. The cut pieces of the film were treated for 192 hours under the conditions of 105° C., 100% RH, and 0.03 MPa. The breaking elongation before and after the treatment was measured based on JIS-C-2318-1997 5.3.31 (tensile strength and stretch rate), and the breaking elongation retention was calculated in accordance with the following formula.

Breaking elongation retention (%)=[(breaking elongation after treatment (MPa))/(breaking elongation before treatment (MPa))]×100

7. Reflection Directivity (60° Gloss Value)

The reflection directivity was measured using a surface gloss meter (a gloss meter VG-SENSOR manufactured by Nippon Denshoku Industries Co., Ltd.) such that the angle of the incident direction (incidence angle) of light was 60 degrees, and the angle of light reception (the acceptance angle) was 60 degrees.

8. Photoelectric Conversion Efficiency

A solar cell module was produced by: preparing, as a solar cell, one using a microcrystalline silicon thin-film formed by the PE-CVD method; placing a glass plate on the front side of the solar cell and placing, on the back side of the solar cell, a sample film on the back side of which an aluminum foil is placed; and laminating and integrating the solar cell and the sample film by a vacuum lamination method, using EVA as a filler. The photoelectric conversion efficiency (%) of the obtained solar cell module was measured, and an evaluation was made on the following criteria.

Excellent: conversion efficiency of 10.5% or greater
Poor: conversion efficiency of less than 10.5%

(1) Polymerizations of Polyester Resins (A-1 and A-2)

The temperature of an esterification reaction can was increased; when the temperature had reached 200° C., slurry containing 86.4 parts by mass of a high-purity terephthalic acid and 64.4 parts by mass of ethylene glycol was introduced into the esterification reaction can; and 0.03 parts by mass of antimony trioxide and 0.16 parts by mass of triethylamine were added as catalysts to the slurry while agitation was being performed. Subsequently, a pressure esterification reaction was performed under the conditions of a gauge pressure of 3.5 kg/cm$^2$ and 240° C. by increasing the pressure and the temperature. Thereafter, the pressure inside the esterification reaction can was returned to normal pressure.

The obtained esterification reaction product was transferred to a polycondensation reaction can 15 minutes later, and was subjected to a polycondensation reaction until the intrinsic viscosity reached 0.65 dl/g under reduced pressure at 280° C.

A polyester (A-1) was obtained by forming polyethylene terephthalate obtained by the polycondensation, into chips by the usual method. At this time, high-precision filtering was performed on the melted resin, maintained at 275° C., using a stainless steel sintered body filter having a filtration particle size (an initial filtering efficiency of 95%) of 5 μm, in order to remove foreign matter contained in the resin.

A polyester resin (A-2) having an intrinsic viscosity of 0.75 dl/g was obtained by performing a solid-phase polymerization of the polyester resin (A-1) at 220° C. under a reduced pressure of 0.5 mmHg, using a rotary vacuum polymerization apparatus.

(2) Polymerizations of Polyester Resins (B-1 and B-2)

To a mixture of bis(2-hydroxyethyl)terephthalate and an oligomer that had been produced from high-purity terephthalic acid and ethylene glycol by the usual method, the following were added as polycondensation catalysts: 13 g/l of an ethylene glycol solution of aluminum chloride such that the aluminum atoms were 0.015 mole % relative to the acid component of the polyester; and 10 g/l of an ethylene glycol solution of Irganox 1425 (manufactured by Ciba Specialty Chemicals plc.) such that Irganox 1425 was 0.02 mole % relative to the acid component. Then, the resulting product was agitated at normal pressure at 245° C. for 10 minutes under a nitrogen atmosphere. Subsequently, while the temperature was increased to 275° C. for 50 minutes, the pressure of the reaction system was gradually reduced to 13.3 Pa (1 Torr). Then, the resulting product was subjected to a polycondensation reaction until the intrinsic viscosity reached 0.65 dl/g at 275° C. and 13.3 Pa. A polyester (B-1) was obtained by forming polyethylene terephthalate obtained by the polycondensation, into chips by the usual method. At this time, high-precision filtering was performed on the melted resin, maintained at 275° C., using a stainless steel sintered body filter having a filtration particle size (an initial filtering efficiency of 95%) of 20 μm, in order to remove foreign matter contained in the resin.

A polyester resin (B-2) having an intrinsic viscosity of 0.75 dl/g was obtained by performing a solid-phase polymerization on the polyester (A-1) at 220° C. under a reduced pressure of 0.5 mmHg, using a rotary vacuum polymerization apparatus.

(3) Polymerization of Polyester Resin (C)

The temperature of an esterification reaction can was increased; when the temperature had reached 200° C., slurry containing 86.4 parts by mass of a high-purity terephthalic acid and 64.4 parts by mass of ethylene glycol was introduced into the esterification reaction can; and 0.03 parts by mass of antimony trioxide and 0.16 parts by mass of triethylamine were added as catalysts to the slurry, and also ethylene glycol slurry of silica particles having an average particle diameter of 2.5 μm was added to the slurry so as to be 2000 ppm relative to the PET to be generated, while agitation was being performed. Subsequently, a pressure esterification reaction was performed under the conditions of a gauge pressure of 3.5 kg/cm$^2$ and 240° C. by increasing the pressure and the temperature. Thereafter, the pressure inside the esterification reaction can was returned to normal pressure.

The obtained esterification reaction product was transferred to a polycondensation reaction can 15 minutes later, and was subjected to a polycondensation reaction until the intrinsic viscosity reached 0.65 dl/g under reduced pressure at 280° C.

A polyester (C) was obtained by forming polyethylene terephthalate obtained by the polycondensation, into chips by the usual method. At this time, high-precision filtering was performed on the melted resin, maintained at 275° C., using a stainless steel sintered body filter having a filtration particle size (an initial filtering efficiency of 95%) of 20 μm, in order to remove foreign matter contained in the resin.

(4) Production of Master Pellet (A)

A master pellet (A) was obtained by: introducing, into a biaxial extruder, 70% by mass of a polymethylpentene resin having a melt flow rate of 180. and 30% by mass of a polystyrene resin having a melt flow rate of 2.0; melt-mixing the resins together at 260° C. to obtain an incompatible thermoplastic resin master batch pellet; and drying the pellet by a hot air of 70° C. for 4 hours.

(5) Production of Master Pellet (B)

Anatase-type titanium oxide particles (a rutile type incorporation rate of 3%) having an average particle diameter of 0.2 μm were dried under the conditions of 170° C. and 10 Pa, using a vacuum oven. Further, the polyester resin (A-1) was dried for 6 hours under the conditions of 140° C. and 10 Pa. 50% by mass of the dried titanium oxide particles and 50% by mass of the polyester resin (A-1) were supplied to a vent-type biaxial extruder, and were preliminarily kneaded at 270° C. An anatase-type titanium oxide particle-containing master batch pellet (B) was obtained by: continuously supplying the preliminarily-kneaded melted resin to a vent-type uniaxial kneader; kneading and extruding the resin at 275° C.; and cooling and cutting the obtained strand.

(6) Production of Master Pellet (C)

In a similar manner to the master pellet (B), a rutile-type titanium oxide particle-containing master batch pellet (C) was obtained using, instead of the anatase-type titanium oxide particles, rutile-type titanium oxide particles (an anatase type incorporation rate of 5%) having an average particle diameter of 0.3 μm.

(7) Production of Master Pellet (D)

Barium sulfate particles having an average particle diameter of 0.7 μm were dried under the conditions of 170° C. and 10 Pa, using a vacuum oven. Further, the polyester resin (A-1) was dried for 6 hours under the conditions of 140° C. and 10 Pa. 50% by mass of the dried barium sulfate particles and 50% by mass of the polyester resin (A-1) were supplied to a vent-type biaxial extruder, and were preliminarily kneaded at 270° C. A master batch pellet (D) was obtained by: continuously supplying the preliminarily-kneaded melted resin to a vent-type uniaxial kneader; kneading and extruding the resin at 275° C.; and cooling and cutting the obtained strand.

Example 1

An unstretched sheet was obtained by: mixing 94 parts by mass of the polyester resin (A-2), vacuum-dried at 180° C. in a vacuum dryer for 3 hours, with 6 parts by mass of the master pellet (A); introducing the mixture into a biaxial screw extruder; melting and extruding the mixture through a T-die at 290° C.; and electrostatically solidifying the extruded mixture in firm contact with a rotary cooling roller. Next, a polyester film having a thickness of 50 μm was obtained by: lengthwise stretching the unstretched sheet 3.1 times at 80° C. by a roller stretching machine; transverse stretching the sheet 3.6 times at 125° C. by a tenter; and performing heat fixation treatment on the sheet at 220° C. for 10 seconds and relaxation heat treatment on the sheet by 4% at 170° C. in the tenter.

Example 2

A polyester film having a thickness of 50 μm was obtained in a similar manner to example 1. except that the polyester resin (A-2) was 93 parts by mass and the master pellet (A) was 7 parts by mass.

Example 3

A polyester film having a thickness of 50 μm was obtained in a similar manner to example 1. except that the polyester resin (A-2) was 92 parts by mass and the master pellet (A) was 8 parts by mass.

Example 4

A polyester film having a thickness of 50 μm was obtained in a similar manner to example 2. except that the polyester resin (A-2) was replaced with the polyester resin (A-1).

Example 5

An unstretched sheet was obtained by: mixing 94.0 parts by mass of the polyester resin (A-2), vacuum-dried at 180° C. in a vacuum dryer for 3 hours, with 6.0 parts by mass of the master pellet (A) to obtain the raw material for the interlayer (the layer B); mixing 99.6 parts by mass of the polyester resin (A-2) with 0.4 parts by mass of the master pellet (B) to obtain the raw material for the outer layers (the layers A); introducing the mixtures separately into two biaxial screw extruders; laminating the mixtures in a T-die; subsequently melting and extruding the laminate through the T-die at 290° C.; and electrostatically solidifying the extruded laminate in firm contact with a rotary cooling roller. Then, a polyester film having a thickness of 50 μm and a layer thickness ratio of the layer A/the layer B/the layer A of 10/80/10 was obtained in a similar manner to example 1.

Example 6

A polyester film having a thickness of 50 μm was obtained in a similar manner to example 5. except that the master pellet (B) was replaced with the polyester resin (C).

Example 7

A polyester film having a thickness of 50 μm was obtained in a similar manner to example 2. except that the polyester resin (A-2) was replaced with the polyester resin (B-2).

Example 8

A polyester film having a thickness of 50 μm was obtained in a similar manner to example 6. except that the polyester resin (A-2) was replaced with the polyester resin (B-2) in both the raw material for the interlayer (the layer B) and the raw material for the outer layers (the layers A).

Example 9

A polyester film was obtained in a similar manner to example 8. except that a final thickness of 50 μm was changed to 100 μm.

Example 10

A polyester film was obtained in a similar manner to example 8. except that a final thickness of 50 μm was changed to 188 μm.

Example 11

(Preparation of Coating Liquid)

A transesterification reaction and a polycondensation reaction were performed by the usual method, whereby a water-dispersible metal sulfonate group-containing copolyester resin was prepared that was composed of: as dicarboxylic acid components, 46 mole % of terephthalic acid, 46 mole % of isophthalic acid, and 8 mole % of sodium 5-sulfonatoisophthalate (relative to all the dicarboxylic acid components); and as glycol components, 50 mole % of ethylene glycol and 50 mole % of neopentyl glycol (relative to all the glycol components). Next, a uniform water-dispersible copolyester resin liquid having a solid concentration of 5.0% by mass was obtained by: mixing 51.4 parts by mass of water, 38 parts by mass of isopropyl alcohol, 5 parts by mass of n-butyl cellosolve, and 0.06 parts by mass of a non-ionic surfactant; subsequently heating and agitating the mixture; when the temperature reached 77° C., adding 5 parts by mass of the water-dispersible metal sulfonate group-containing copolyester resin to the mixture; agitating the resulting product until there were no lumps of resin; and cooling the aqueous dispersion of the resin to normal temperature. Further, a coating liquid was obtained by: dispersing 3 parts by mass of aggregate silica particles (an average particle diameter of 1.4 μm) in 50 parts by mass of water; subsequently adding 0.54 parts by mass of the aqueous dispersion of the aggregate silica particles to 99.46 parts by mass of the water-dispersible copolymerized polyester resin liquid; and adding 20 parts by mass of water to the resulting product while performing agitation.

An unstretched sheet was obtained in a similar manner to example 8. Then, the coating liquid was applied to one side of the unstretched sheet so as to have an final coating amount of 0.08 g/m², and was dried at 135° C.

Then, a polyester film having a thickness of 50 um was obtained in a similar manner to example 8.

Example 12

In the following manner, a silver laminated film was adhered to one side of the polyester film obtained in example 1. A pressure-sensitive adhesive layer was formed by: applying a pressure-sensitive adhesive (X395-270S-1 manufactured by Saiden Chemical Industry Co., Ltd.) so as to be 30 g/m² in a wet state by a die coating method; and drying the pressure-sensitive adhesive at 100° C. for 1 minute. A laminated polyester film was obtained by: placing on the pressure-sensitive adhesive surface a polyethylene terephthalate film having a thickness of 12 μm on which a metallic silver layer having a thickness of 50 nm was laminated by a deposition method; guiding the silver laminated film and the polyester film between two rubber rollers; and adhering the silver laminated film and the polyester film by compression-bonding them.

Comparative Example 1

A polyester film having a thickness of 50 μm was obtained in a similar manner to example 1. except that the polyester resin (A-1) was mixed with the polyester resin (C) such that the silica particle concentration was 300 ppm, to obtain the raw material for the polyester film.

Comparative Example 2

A polyester film having a thickness of 50 μm was obtained in a similar manner to example 1. except that the polyester resin (A-2) was 97 parts by mass and the master pellet (A) was 3 parts by mass.

Comparative Example 3

A polyester film having a thickness of 50 μm was obtained in a similar manner to example 1. except that the polyester resin (A-2) was 90 parts by mass and the master pellet (A) was 10 parts by mass.

Comparative Example 4

A polyester film having a thickness of 50 μm was obtained in a similar manner to example 1. except that the polyester resin (A-2) was 90 parts by mass and the polymethylpentene resin having a melt flow rate of 180 was 10 parts by mass.

Comparative Example 5

A polyester film having a thickness of 50 μm was obtained in a similar manner to example 1. except that the polyester resin (A-2) was mixed with the master pellet (C) such that the titanium oxide particle concentration was 35%, to obtain the raw material for the polyester film.

Comparative Example 6

A polyester film having a thickness of 50 μm was obtained in a similar manner to example 1. except that the polyester resin (A-2) was mixed with the master pellet (D) such that the barium sulfate particle concentration was 35%, to obtain the raw material for the polyester film.

TABLE 1

|  | Average reflectance of the film alone (%) | Average transmittance (%) | Cyclic trimer content (ppm) | Average reflectance of the light reflecting layer laminated film (%) | 60° Gloss Value | Breaking elongation retention (%) | Photoelectric conversion efficiency (%) |
|---|---|---|---|---|---|---|---|
| Example 1 | 73 | 30 | 4800 | 95 | 60 | 70 | Excellent |
| Example 2 | 77 | 22 | 4800 | 95 | 64 | 70 | Excellent |
| Example 3 | 81 | 19 | 4800 | 93 | 67 | 70 | Excellent |
| Example 4 | 77 | 22 | 9200 | 95 | 64 | 5 | Excellent |
| Example 5 | 83 | 16 | 4800 | 92 | 50 | 72 | Excellent |
| Example 6 | 85 | 13 | 4800 | 91 | 52 | 72 | Excellent |
| Example 7 | 77 | 22 | 4500 | 95 | 52 | 72 | Excellent |
| Example 8 | 85 | 16 | 4500 | 92 | 52 | 72 | Excellent |
| Example 9 | 87 | 10 | 4500 | 95 | 52 | 72 | Excellent |
| Example 10 | 91 | 6 | 4500 | 96 | 52 | 72 | Excellent |
| Example 11 | 84 | 17 | 4500 | 92 | 15 | 72 | Excellent |
| Example 12 | — | — | — | 105 | — | — | Excellent |
| Com. Example 1 | 4 | 90 | 9200 | 99 | 190 | 5 | Excellent |
| Com. Example 2 | 69 | 51 | 4900 | 95 | 71 | 68 | Excellent |
| Com. Example 3 | 82 | 4 | 5200 | 89 | 35 | 65 | Poor |
| Com. Example 4 | 91 | 15 | 4800 | 86 | 30 | 70 | Poor |
| Com. Example 5 | 86 | 4 | 6300 | 87 | 52 | 50 | Poor |
| Com. Example 6 | 87 | 3 | 6300 | 88 | 52 | 50 | Poor |

INDUSTRIAL APPLICABILITY

The polyester film for solar cells of the present invention is useful as a component of a back sheet for solar cells, included in a solar cell having a thin-film solar cell element, that requires a high reflectance not only in the visible light region but also in the near-infrared region, and also requires a low reflection directivity.

The invention claimed is:
1. A polyester film for solar cells comprising a cavity-containing polyester film having:
   an average reflectance of 70% or greater and 95% or less in a wavelength range of from 400 to 1200 nm; and
   an average transmittance of 5% or greater and 30% or less in a wavelength range of from 700 to 1200 nm;
   wherein the cavity-containing polyester film comprises (a) a polyester resin, (b) an incompatible thermoplastic resin, which is incompatible with the polyester resin, and (c) a dispersion thermoplastic resin, which is incompatible with both the polyester resin and the incompatible thermoplastic resin;
   the incompatible thermoplastic resin is present in 4 to 8 parts relative to 100 parts by mass of the polyester resin; and
   the dispersion thermoplastic resin is present in 10 to 50 parts relative to 100 parts by mass of the incompatible thermoplastic resin.
2. The polyester film for solar cells according to claim 1, wherein a cyclic trimer content of the polyester film is 5000 ppm or less.

3. The polyester film for solar cells according to claim 2, wherein the polyester film contains aluminum and/or a compound thereof and a phenolic compound.

4. A back sheet for solar cells comprising:
the polyester film for solar cells according to claim 3; and
a light reflecting layer placed on one side of the polyester film for solar cells.

5. The back sheet for solar cells according to claim 4, wherein the light reflecting layer is a metal foil or a metallic thin-film layer containing at least one of aluminum and silver.

6. A back sheet for solar cells comprising:
the polyester film for solar cells according to claim 2; and
a light reflecting layer placed on one side of the polyester film for solar cells.

7. The back sheet for solar cells according to claim 6, wherein the light reflecting layer is a metal foil or a metallic thin-film layer containing at least one of aluminum and silver.

8. The polyester film for solar cells according to claim 1, wherein the polyester film contains aluminum and/or a compound thereof and a phenolic compound.

9. A back sheet for solar cells comprising:
the polyester film for solar cells according to claim 8; and
a light reflecting layer placed on one side of the polyester film for solar cells.

10. The back sheet for solar cells according to claim 9, wherein the light reflecting layer is a metal foil or a metallic thin-film layer containing at least one of aluminum and silver.

11. A back sheet for solar cells comprising:
the polyester film for solar cells according to claim 1; and
a light reflecting layer placed on one side of the polyester film for solar cells.

12. The back sheet for solar cells according to claim 11, wherein the light reflecting layer is a metal foil or a metallic thin-film layer containing at least one of aluminum and silver.

* * * * *